United States Patent [19]

Dönig

[11] Patent Number: 4,470,095
[45] Date of Patent: Sep. 4, 1984

[54] COIL EXCITATION ARRANGEMENT FOR PRODUCING A PULSE-SHAPED FIELD OF CONSTANT INTENSITY

[75] Inventor: Gerhard Dönig, Erlangen, Fed. Rep. of Germany

[73] Assignee: Siemens Aktiengesellschaft, Munich, Fed. Rep. of Germany

[21] Appl. No.: 362,845

[22] Filed: Mar. 29, 1982

[30] Foreign Application Priority Data

Mar. 27, 1981 [DE] Fed. Rep. of Germany ....... 3112280

[51] Int. Cl.³ ........................................... H01H 47/32
[52] U.S. Cl. ..................................... 361/153; 361/154
[58] Field of Search ...................... 361/152, 153, 154

[56] References Cited

U.S. PATENT DOCUMENTS 3,678,298 7/1972 Dyer ............................. 361/154 X
4,319,301 3/1982 Hill ................................. 361/154 X

FOREIGN PATENT DOCUMENTS 3028442 3/1982 Fed. Rep. of Germany ...... 361/154

Primary Examiner—Reinhard J. Eisenzopf
Attorney, Agent, or Firm—Kenyon & Kenyon

[57] ABSTRACT

An embodiment of the present invention provides an excitation arrangement suitable for use in producing a pulse-shaped field of substantially constant intensity. To start-up the current at the beginning of a pulse, a coil (1) is fed with a high voltage (line 3) via an ignitable and blockable power semiconductor (7). For the duration of the pulse, switch-over is then effected to the supply of a lower voltage (line 4) by means of a power transistor (31) controllable to a constant current. Free-running diodes are used to decay the current. One coil end (2) is preferably connected via an FET (7) which is controllable to a constant voltage, to the high voltage; via an FET (30), which is likewise controllable to a constant voltage, to the lower-voltage (4); and via a controllable FET (52) to a reference line (6). Corresponding FET's (50, 51, 31) are provided at the other coil end (5). The controllable FET's (51, 52) require no potential-isolated control, and moreover, the power-FET's do not require their own additional free-running diodes (mentioned above) due to their inherent diode characteristic for currents flowing in the blocking direction.

6 Claims, 5 Drawing Figures

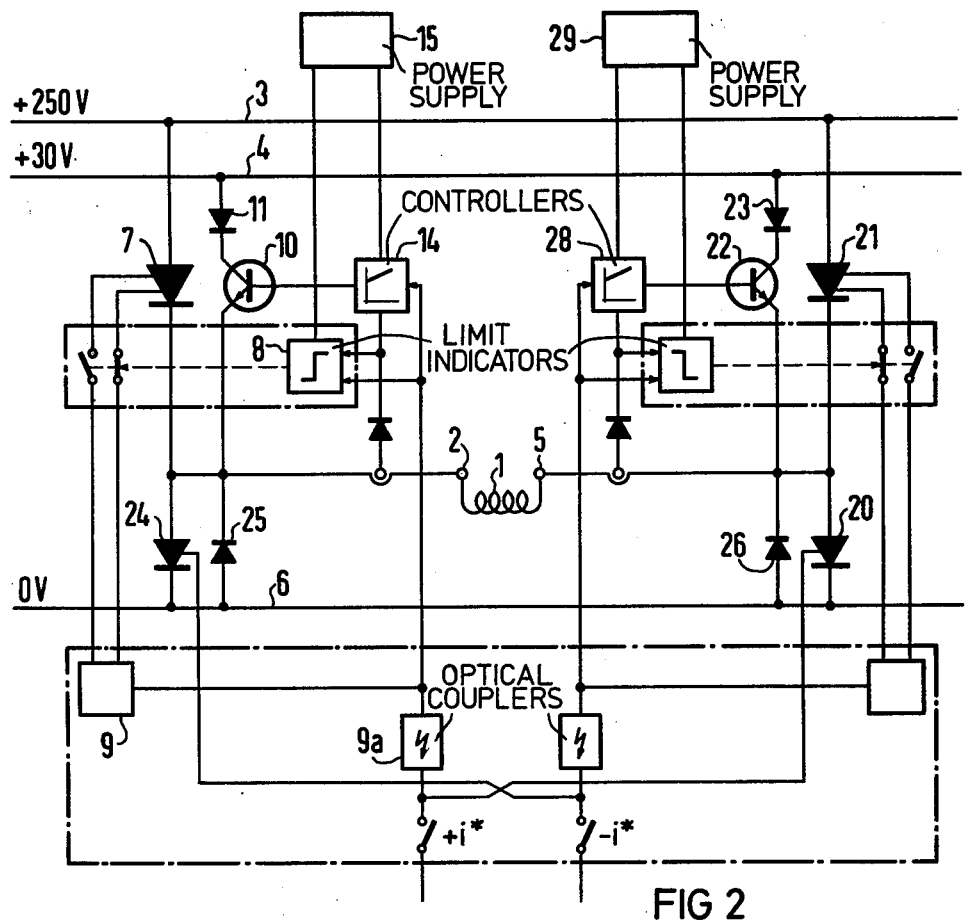
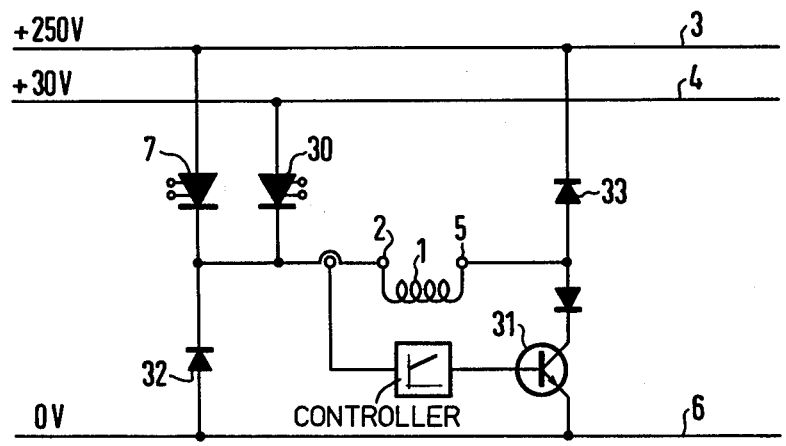

COIL EXCITATION ARRANGEMENT FOR PRODUCING A PULSE-SHAPED FIELD OF CONSTANT INTENSITY

BACKGROUND OF THE INVENTION

This invention relates to an excitation arrangement suitable for use in producing a pulse-shaped field of a substantially constant intensity by exciting a coil.

In many cases of application, e.g. in a device for Zeugmatographie or other medicinal diagnoses, current supplies are required which can produce pulse-shaped fields of a constant intensity. The build-up of the field, i.e. the starting-up of the excitation current, must be effected in very short connection times, which preferably should amount for example to only about 100 $\mu s$.

SUMMARY OF THE INVENTION

According to the present invention there is provided an excitation arrangement suitable for use in producing a pulse-shaped field of a substantially constant intensity, comprising a coil to be excited, a high-voltage current feed line, a low-voltage current feed line, a power semiconductor device which is arranged to allow the supply of excitation current to the coil from the high-voltage current line and which can be switched-on to start-up an excitation current pulse and blocked after a short starting-up time, and a power transistor which is arranged to allow the supply of excitation current to the coil from the low-voltage current line until the end of the current pulse, the power transistor being arranged to maintain the amplitude of the current pulse substantially constant, and the excitation arrangement further comprising free-running diode means for use in quenching the coil current at the end of the current pulse.

For the production of such pulse-shaped fields as have been mentioned previously, an embodiment may be created according to the invention with which the excitation current of the coil can be started-up within a very short time and then be kept at a substantially constant intensity until the end of the pulse with as little loss as possible.

Starting up the excitation current by means of the high feed voltage and decaying the current by means of the free-running diode means may be carried out with a high degree of over-excitation. Relatively low losses may occur for the duration of the pulse itself through feeding with the low feed voltage whereby, in addition, the field intensity may be regulated to a high degree of accuracy (e.g. $\pm 0.4\%$) by means of the current regulation.

If pulses are to be produced with which the direction of the field intensity alternates, then a second power semi-conductor device and power transistor respectively can be used, with which the coil is excited with a reversed direction of current. Regulation of the current for the duration of the pulse can be effected by the controllable power transistor being coupled to the coil terminal leading to the lower-voltage feed line, but an ignitable and blockable semiconductor valve can also be used in place of this, and the coil current can be regulated by the power transistor being coupled to the coil terminal leading to a reference line. This is particularly advantageous since then the control voltage for the power semi-conductor device or valve is to be determined in relation to a fixed reference potential, whilst, in the case of the above arrangement, jumping reference potentials occur at the coil terminal.

Disconnectable thyristors or normal thyristors can be used as power semiconductor devices and semiconductor valves, to which a quenching device, preferably a common quenching device, is assigned. The use of power field effect transistors (power FET's) is particularly advantageous, which can be blocked in a forward direction and have an amplification which is regulable by means of the control voltage, but have a diode characteristic in the reverse direction. Such power-FET's are known commercially under the registered trade name SIPMOS of the firm Siemens. These transistors can be used not only as power transistors for regulating the current for the duration of the pulse, but also advantageously as power semiconductors and valves, in which one opposite-pole free-running diode is integrated in each case and which are switched on and off by a constant control voltage for the duration of the pulse (digital control commands).

Advantageous further developments of the invention are set out in the sub-claims.

BRIEF DESCRIPTION OF THE DRAWINGS

Comprehension of the invention is facilitated by reading the following detailed description in conjunction with the annexed drawings, in which:

FIG. 2 is a schematic and block and line representation of an embodiment of the invention wherein the field direction of the coil can be reversed;

FIG. 3 is a schematic and block and line representation of an embodiment of the invention which utilizes semiconductor devices which can be switched-on and switched-off;

DETAILED DESCRIPTION

In the figures, one end 2 of a coil 1 is connected in each case to the higher-voltage (e.g. 250 V) feed line 3 and the lower-voltage (e.g. 30 V) direct voltage feed line 4, whilst the other coil end 5 is connected to the common reference line 6 to which reference potential (e.g. 0 V) is applied.

Figure 1:
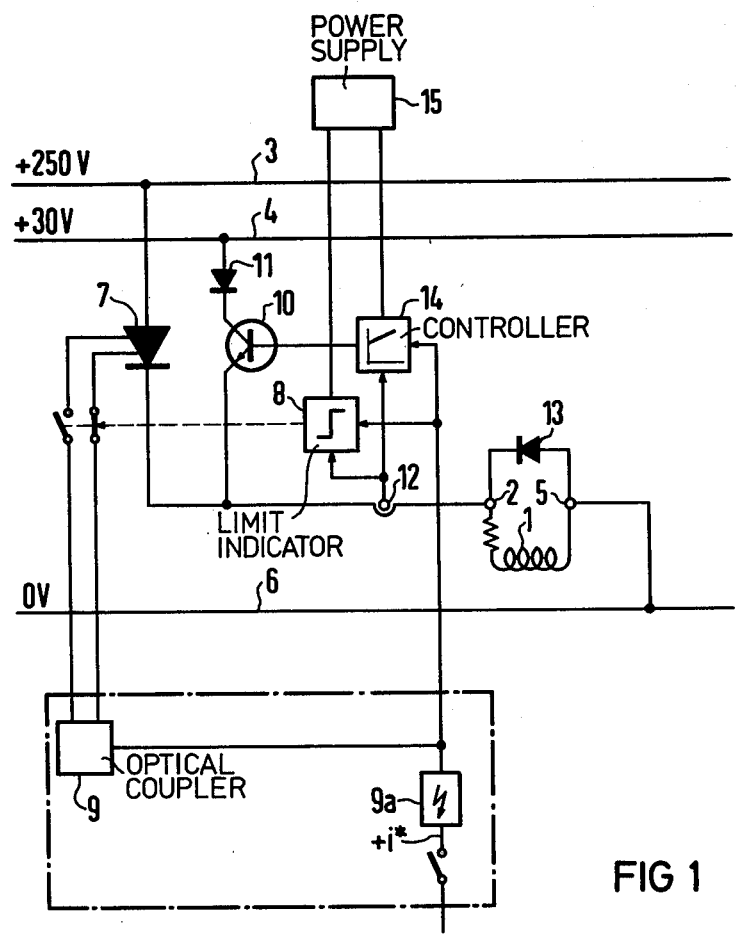
FIG. 1 is a schematic and block and line representation of an embodiment of the invention.

According to FIG. 1, a first power semiconductor 7 leads from the higher-voltage reference line 3 to one coil end 2. The other coil end 5 can be connected for example directly to the reference line 6. The power semiconductor 7 can be switched-on to start-up the excitation current and after a short starting time, for example, when a desired current value i* has been reached, can be blocked again, as shown symbolically in FIG. 1 by the threshold value indicator 8 and appropriately controlled switches. The power semiconductor 7 can be, for example, a disconnectable or blockable thyristor, whose switch-on and -off input is controlled by means of a control 9a, potential-isolated, e.g. by means of optocouplers 9, because of the jumping potential at the coil terminal 2.

A first power transistor 10, to which preferably a diode 11 is connected in series, leads from the lower-voltage feed line 4 to the coil terminal 2. The coil current can be determined by means of a measuring member 12, so that the current flow through the controlled first transistor 10 starts when the desired current value is reached simultaneously with the order to block the power semiconductor 7, whereby the control signal for the first transistor 10 can be formed from a control comparison with the predetermined constant actual value i* (regulator 14). As a rule, potential-free control is also provided for the transistor 10, and a potential-free power supply unit 15 for the regulator 14. The end of a pulse is initiated by appropriate blocking of the control signal for the transistor 10, whereby the coil current decays quickly by means of the free-running diode 13.

According to FIG. 2, this idea can be expanded-upon in such a way that even a reversal in field direction is possible. In this case too, the first power semiconductor 7, which can be switched-on and blocked, leads from the line 3 on to the coil terminal 2 and the first power transistor 10 from the feed line 4 to the coil terminal 2. A valve 20, which can be ignited with the connection impulse for the power semi-conductor 7, leads from the other coil end 5. Similarly, for the reversed current supply direction, a second power transistor 22, connected to the feed line 4 and to which in turn a diode 23 can be connected in series, leads to the coil terminal 5 and an ignitable valve 24 from the coil terminal 2 to the reference line 6.

The free-running of the coil current can be effected by two free-running diodes 25 and 26 being connected in each case antiparallel to the valves 24 and 20, so that there is one respective free-running circuit (1, 20, 6, 25, respectively 1, 24, 6, 26) for each current supply direction. It is also possible to use blockable valves as valves 20, 24 to switch-off the excitation and to connect the free-running diodes antiparallel to the power transistors 10, 22, whereby, during the current decay, the power transistors are temporarily controlled to still be in a current-carrying state, so that the power transistor, feed line 4 and free-running diode each produce a free-running circuit. In particular, it is also possible, as will be shown with the use of FIG. 4, to connect one respective free-running diode antiparallel both to the valves 20, 24 and the power transistors 10, 22 or respectively the power semiconductors 7, 21, so that a feed-back of the current into the line 3 or 4 takes place.

A field in a direction opposite to that in FIG. 1 can be produced only by imposing an appropriate desired value $-i^*$ on to the regulator 28 and by corresponding control of 21 and 22, whereby the regulator 28 uses its own power supply unit 29 and the power semiconductor 21 (corresponding to 7) uses its own potential-free control.

Although, in another embodiment according to FIG. 3, the first power semiconductor 7 likewise leads from the higher-voltage feed line 3 to the coil end 2, a semiconductor valve 30, which can be ignited after the first power semiconductor has been blocked, leads from the lower-voltage feed line 4 to the coil terminal 2. The power transistor or semiconductor 31 corresponding to the power transistor or semiconductor 10 in FIGS. 1 and 2, leads from the coil terminal 5 to the reference line 6. To terminate a pulse, the current from the feed line can be terminated by blocking 30 and/or 31. For the free-running of the coil current, a free-running diode can be provided, corresponding to diode 13 in FIG. 1, but the possibilities outlined above for feeding back into a feed line e.g. by two free-running diodes 32, 33 still occur. The control of the individual elements is effected similarly to that in FIGS. 1 and 2 and is not shown in detail in FIG. 3.

Figure 4:
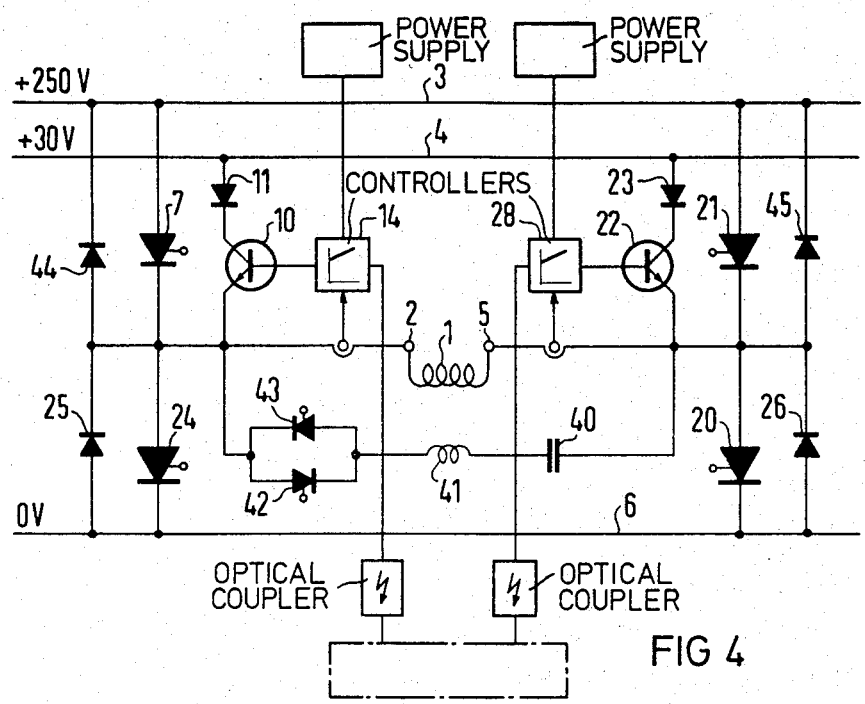
FIG. 4 is a schematic and block and line representation of a reversing field embodiment of the invention which utilizes conventional thyristors and a quench arrangement.

As mentioned above, disconnectable thyristors are particularly suitable as semiconductor valves and power semi-conductors. Normal thyristors to which a quenching device is assigned can, however, also be used. It is particularly advantageous to assign a common quenching circuit to the thyristors. This is shown in FIG. 4, which otherwise corresponds to FIG. 2, by the quenching capacitor 40 with the quenching coil 41 in series and the antiparallel connection of the thyristors 42 and 43. If the thyristor 42 is ignited simultaneously with the power semiconductor 7, then the capacitor 40 is loaded and the thyristor 42 quenched again. To quench the thyristor used as a power semiconductor 7, an ignition impulse can be given to the thyristor 43. By exchanging the roles of the thyristors 42 and 43, it is also possible to quench the thyristor 21. As already mentioned, the four diodes 25, 26, 44, 45 can be used for the free-running.

The circuit can be considerably simplified if, in place of the power semiconductors, semiconductor valves and power transistors, the said power field effect transistors are used, which have a diode characteristic in reverse direction. This is shown in FIG. 5, which represents an extension of FIG. 3 for a reversal of field direction and whose elements common to FIG. 3 are given the same reference symbols.

Corresponding to the power semiconductor 7 and to the valve 30 at the coil terminal 2, a power semiconductor 50 leads from the reference line 3 to the coil terminal 5 and a valve 51 from the reference line 4. Corresponding to the power transistor 31, a power transistor 52 leads from the coil terminal 2 to the reference line 6. If normal thyristors were used, then at least two free-running diodes would have to be provided, of which one would be connected antiparallel to the first semi-conductor, power transistor or semiconductor valve and the second to the second power semiconductor, power transistor or semiconductor valve. Since, however, in this case, power field effect transistors are used in place of thyristors, which already have integrated antiparallel diodes (as shown by the arrow in the transistor-symbol), separate free-running diodes are not necessary. If, on the contrary, these power FET's are controlled with digital control signals, then they fulfill the function of an ignitable and blockable power semiconductor or respectively (provided that a diode poled on the current-supply direction follows it) of an ignitable and blockable semiconductor valve.

Figure 5:
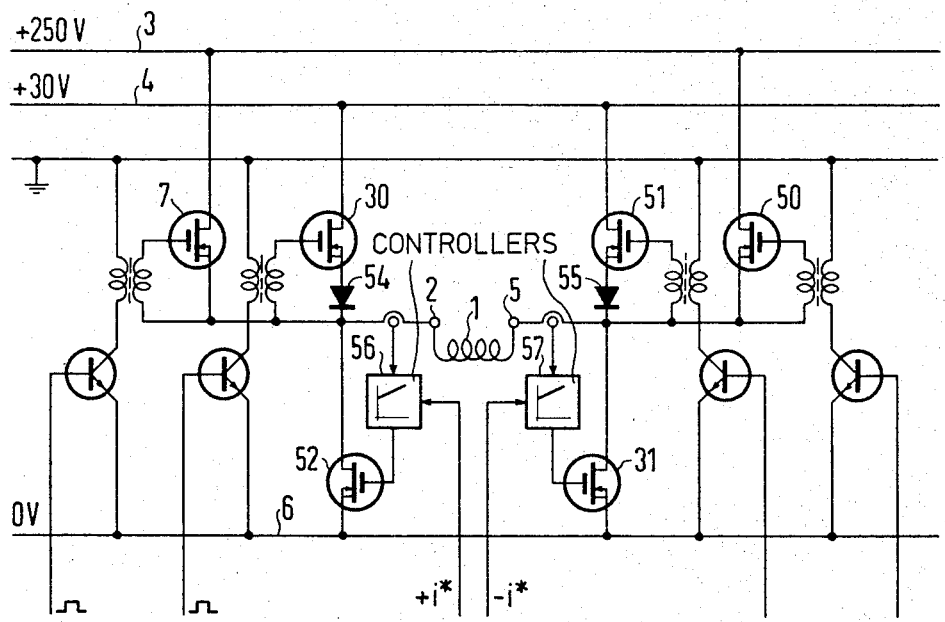
FIG. 5 is a schematic and block and line representation of an embodiment of the invention wherein coil current is controlled by FETs.

The arrangement according to FIG. 5 controls the current by controlling the FET's 31 and 52 by means of the regulators 56, 57, whilst the digitally controlled FET's 30, 51 operate as valves due to the arrangement of the diodes 54, and 55. If the diodes 54, 55 are connected in series with the FET's 31 and 52 in this case to be controlled with digital signals, and the regulators 56, 57 are assigned to the FET's 30, 51, then although the current can be adjusted to be constant, the arrangement shown in FIG. 5 still has the advantage that the regulators 56, 57 operate against the fixed reference potential of the reference line 6 and thus no potential -isolation and no separate power supply units are necessary. The potential-free control of the elements 7, 30, 50 and 51 can be effected simply with transducers, to which a constant digital signal is advanced without any great expense, which is applied for the duration of a pulse. This reduces the expenditure for the whole structural part.

Although the invention has been described in terms of specific embodiments for specific applications, it is to be understood that, in light of this teaching, persons skilled in the art can generate additional embodiments without departing from the spirit or exceeding the scope of the claimed invention. The drawings and description in this disclosure are proffered to facilitate comprehension of the invention, and should not be construed to limit the scope thereof.

I claim:

1. An excitation arrangement suitable for use in producing a pulse-shaped field of a substantially constant intensity, comprising a coil to be excited, a high-voltage current feed line, a low-voltage current feed line, a power semiconductor device which is arranged to allow the supply of excitation current to the coil from the high-voltage current line and which can be switched-on to start-up an excitation current pulse and blocked after a short starting-up time, and a power transistor which is arranged to allow the supply of excitation current to the coil from the low-voltage current line until the end of the current pulse, the power transistor being arranged to maintain the amplitude of the current pulse substantially constant, a further power semiconductor device which is arranged to allow the supply of excitation current to the coil, in a direction opposite to that of said power semiconductor device, a further power transistor which is arranged to allow the supply of excitation current to the coil from the low-voltage current line until the end of the current pulse and arranged to provide an excitation current pulse in a direction opposite to that of said power transistor, and at least first and second free-running diodes, said first free-running diode being arranged to be connected antiparallel to a selectable one of the power semiconductor device and power transistor, said second free-running diode being connected antiparallel to a selectable one of said further power semiconductor device and said further power transistor.

2. An arrangement for generating a pulse-shaped field of constant strength, the arrangement being of the type which excites a coil, the arrangement further comprising:

first terminal means for receiving a reference voltage;
second terminal means for receiving a first voltage with respect to said reference voltage;
third terminal means for receiving a second voltage having a magnitude intermediate of said first and said reference voltages;
a first shunt path including the coil, said first shunt path being coupled electrically between said first and second terminal means, there being further provided a first power semiconductor connected electrically intermediate of the coil and said second terminal means, said first power semiconductor being switched into a conductive state at the commencement of a first pulse, and switched into a nonconductive state when a current through the coil reaches a predetermined threshold value;
a second shunt path including the coil, said second shunt path being connected electrically between said first and third terminal means, said second shunt path being further provided with a first switching element connected electrically intermediate of the coil and said third terminal means, said first switching element being switched into a conductive state when said first power semiconductor is switched into a nonconductive state, said first switching element being switched into a nonconductive state upon the termination of said first pulse;
wherein the first and second shunt paths are each coupled to said first terminal means via a second switching element which is switched into a conductive state during the duration of said first pulse;
a third shunt path including the coil, the third shunt path being coupled electrically between the first and second terminal means, said third shunt path conducting current through the coil in a direction opposite to a direction of current conduction of said first and second shunt paths, said third shunt path being further provided with a second power semiconductor connected electrically intermediate of the coil and said second terminal means, said second power semiconductor being switched into a conductive state at the commencement of a second pulse, said second power semiconductor being switched into a nonconductive state when a current through the coil reaches a second predetermined threshold;
a fourth shunt path including the coil, said fourth shunt path being connected electrically between said first and third terminal means, said fourth shunt path being provided with a third switching element connected electrically intermediate of the coil and said third terminal means, said third switching element being switched into a conductive state upon the switching of the second power semiconductor into a nonconductive state, said third switching element remaining in said conductive state until the termination of said second pulse;
said third and fourth shunt paths being connected to said first terminal means via a fourth switching element, said fourth switching element being switched into a conductive state for the duration of said second pulse;
a selectable group of said first and third switching elements, and said second and fourth switching elements being power transistors arranged to conduct current in a direction corresponding to the direction of current flow in their respective shunt paths, the switching elements in the other of said selected group being semiconductor valves arranged to conduct current in a direction corresponding to that of the respective shunt paths; and
a plurality of bypass diodes, each bypass diode being arranged in association with a respective one of said switching elements.

3. The arrangement of claim 2 wherein selected ones of said power semiconductors are thyristors of a type which can be switched into a nonconductive state.

4. The arrangement of claim 2 wherein selected ones of said power semiconductors are thyristors of a type which cannot be switched into a nonconductive state, there being further provided a common quenching circuit for discontinuing current through said thyristors.

5. The arrangement of claim 2 wherein selected ones of said power semiconductors are power field-effect transistors which are addressable by a digital pulse of constant amplitude, there being further provided a respective diode connected in series with each of said power field-effect transistors.

6. The arrangement of claim 5 wherein said power transistors are power field-effect transistors, there being further provided a plurality of respectively associated antiparallel-connected diodes for operating as bypass diodes.

* * * * *